(12) United States Patent
Sekiya et al.

(10) Patent No.: US 10,601,389 B2
(45) Date of Patent: Mar. 24, 2020

(54) ELASTIC WAVE DEVICE

(71) Applicant: Murata Manufacturing Co., Ltd., Nagaokakyo-shi, Kyoto-fu (JP)

(72) Inventors: Daisuke Sekiya, Nagaokakyo (JP); Taku Kikuchi, Nagaokakyo (JP); Hiroshi Tanaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 363 days.

(21) Appl. No.: 15/586,315

(22) Filed: May 4, 2017

(65) Prior Publication Data

US 2017/0237406 A1 Aug. 17, 2017

Related U.S. Application Data

(63) Continuation of application No. PCT/JP2015/083998, filed on Dec. 3, 2015.

(30) Foreign Application Priority Data

Dec. 4, 2014 (JP) ................................. 2014-245794

(51) Int. Cl.
*H03H 9/25* (2006.01)
*H03H 3/10* (2006.01)
(Continued)

(52) U.S. Cl.
CPC ............. *H03H 3/10* (2013.01); *H01L 23/367* (2013.01); *H01L 41/297* (2013.01);
(Continued)

(58) Field of Classification Search
CPC ........ H03H 3/02; H03H 3/08; H03H 9/02834; H03H 9/059; H03H 9/1071; H03H 9/145;
(Continued)

(56) References Cited

U.S. PATENT DOCUMENTS

2002/0000895 A1* 1/2002 Takahashi ............ H03H 9/0576
333/133
2006/0049896 A1 3/2006 Onozawa
(Continued)

FOREIGN PATENT DOCUMENTS

| JP | 2000-183679 A | 6/2000 |
|---|---|---|
| JP | 2002-076828 A | 3/2002 |

(Continued)

OTHER PUBLICATIONS

Official Communication issued in International Patent Application No. PCT/JP2015/083998, dated Jan. 12, 2016.
Official Communication issued in corresponding Korean Patent Application No. 10-2017-7014262, dated Apr. 19, 2018.

*Primary Examiner* — Thomas M Dougherty
(74) *Attorney, Agent, or Firm* — Keating & Bennett, LLP

(57) ABSTRACT

An elastic wave device includes IDT electrodes on a first main surface of a piezoelectric substrate and a heat dissipating film on a second main surface and including a pair of opposing main surfaces and side surfaces connecting the pair of main surfaces. At least a portion of the side surfaces of the heat dissipating film is located in an inner side portion relative to the outer circumference of the second main surface of the piezoelectric substrate on an arbitrary cross section along a direction connecting the pair of main surfaces of the heat dissipating film.

10 Claims, 9 Drawing Sheets

(51) Int. Cl.
*H03H 3/08* (2006.01)
*H03H 9/02* (2006.01)
*H03H 9/05* (2006.01)
*H03H 9/10* (2006.01)
*H03H 9/145* (2006.01)
*H03H 9/64* (2006.01)
*H01L 23/367* (2006.01)
*H01L 41/297* (2013.01)
*H01L 41/337* (2013.01)
*H01L 41/338* (2013.01)
*H01L 41/053* (2006.01)

(52) U.S. Cl.
CPC .......... *H01L 41/337* (2013.01); *H01L 41/338* (2013.01); *H03H 3/08* (2013.01); *H03H 9/02834* (2013.01); *H03H 9/059* (2013.01); *H03H 9/1071* (2013.01); *H03H 9/145* (2013.01); *H03H 9/25* (2013.01); *H03H 9/64* (2013.01); *H01L 41/0533* (2013.01); *H01L 2924/0002* (2013.01)

(58) Field of Classification Search
CPC .......... H03H 9/25; H03H 9/64; H01L 23/367; H01L 41/337; H01L 41/338; H01L 41/0533; H01L 2924/0002
USPC ............. 310/313 A–313 D, 313 R, 340–346; 333/193–196
See application file for complete search history.

(56) References Cited

U.S. PATENT DOCUMENTS

| | | |
|---|---|---|
| 2010/0043189 A1 | 2/2010 | Fukano |
| 2010/0289600 A1 | 11/2010 | Takada et al. |
| 2011/0043078 A1 | 2/2011 | Tsuda |
| 2015/0008789 A1 * | 1/2015 | Iwamoto .................. H03H 3/10 310/313 R |

FOREIGN PATENT DOCUMENTS

| | | | | |
|---|---|---|---|---|
| JP | 2002-134441 A | | 5/2002 | |
| JP | 2002-255690 A | | 9/2002 | |
| JP | 2006-14095 A | * | 6/2004 | ............... H04B 1/03 |
| JP | 2004-253937 A | | 9/2004 | |
| JP | 2004-260410 A | | 9/2004 | |
| JP | 2005-217670 A | * | 8/2005 | ............... H03H 9/25 |
| JP | 2005-217670 A | | 8/2005 | |
| JP | 2006-080921 A | | 3/2006 | |
| JP | 2007-116628 A | | 5/2007 | |
| JP | 2007-281846 A | | 10/2007 | |
| JP | 2008-072771 A | | 3/2008 | |
| JP | 2010-233122 A | | 10/2010 | |
| JP | 2010-252210 A | | 11/2010 | |
| KR | 10-2011-0019332 A | | 2/2011 | |
| WO | 2008/018452 A1 | | 2/2008 | |
| WO | 2009/104438 A1 | | 8/2009 | |
| WO | 2013/035819 A1 | | 3/2013 | |

* cited by examiner

ELASTIC WAVE DEVICE

CROSS REFERENCE TO RELATED APPLICATIONS

This application claims the benefit of priority to Japanese Patent Application No. 2014-245794 filed on Dec. 4, 2014 and is a Continuation Application of PCT Application No. PCT/JP2015/083998 filed on Dec. 3, 2015. The entire contents of each application are hereby incorporated herein by reference.

BACKGROUND OF THE INVENTION

1. Field of the Invention

The present invention relates to a method for manufacturing an elastic wave device and the elastic wave device.

2. Description of the Related Art

When a surface acoustic wave device is manufactured, a mother substrate is segmented into individual piezoelectric substrates as units of electronic components. In International Publication No. WO 08/018452, first, a metal film is formed on the overall upper surface of a mother substrate. Then, the mother substrate on which the metal film has been formed is segmented into individual piezoelectric substrates.

In Japanese Unexamined Patent Application Publication No. 2006-80921 and International Publication No. WO 13/035819, a metal film or a conductor film is formed not only on the upper surface of a piezoelectric substrate but also on the side surfaces thereof. With this, in Japanese Unexamined Patent Application Publication No. 2006-80921, charging of a resin member in a surface acoustic wave chip is prevented. In International Publication No. WO 13/035819, an electromagnetic wave shield effect of an electronic component is enhanced.

In the manufacturing method disclosed in International Publication No. WO 08/018452, segmentation is performed after the metal film is formed. In this case, the metal film is possibly extended in the segmentation because of high ductility and malleability of metal. For this reason, there is a risk that the metal film protrudes to the lateral sides from end edges of the segmented piezoelectric substrates or reaches parts of the side surfaces thereof.

On the other hand, in the manufacturing methods disclosed in Japanese Unexamined Patent Application Publication No. 2006-80921 and International Publication No. WO 13/035819, the conductor film or the metal film is formed not only on the overall upper surface of the piezoelectric substrate but also on the side surfaces thereof.

Accordingly, in each of elastic wave devices provided by the manufacturing methods disclosed in International Publication No. WO 08/018452, Japanese Unexamined Patent Application Publication No. 2006-80921 and International Publication No. WO 13/035819, there is a risk that the metal film may make contact with other conductive parts and other electronic components and short-circuit breakdown occurs. In recent years, a metal film as a heat dissipating film has been tried to be provided on one main surface of a piezoelectric substrate in order to enhance heat dissipation property. Also in the configuration provided with the heat dissipating film, contact between the heat dissipating film and other portions and contact between the heat dissipating film and other conductive parts such as electronic components are required to be prevented.

SUMMARY OF THE INVENTION

Preferred embodiments of the present invention provide method for manufacturing an elastic wave device and elastic wave devices that prevent contact between a heat dissipating film and other portions and other components by devising a shape of the heat dissipating film.

A method for manufacturing an elastic wave device according to a preferred embodiment of the present invention includes providing an interdigital transducer (IDT) electrode on a first main surface of a piezoelectric substrate including first and second opposing main surfaces, and forming a heat dissipating film including a pair of opposing main surfaces and side surfaces connecting the pair of main surfaces on the second main surface of the piezoelectric substrate, wherein in the forming of the heat dissipating film, the heat dissipating film is formed such that at least a portion of the side surfaces of the heat dissipating film is located in an inner side portion relative to an outer circumference of the second main surface of the piezoelectric substrate on an arbitrary cross section along a direction connecting the pair of main surfaces of the heat dissipating film.

In a specific aspect of a method for manufacturing an elastic wave device according to a preferred embodiment of the present invention, in the forming of the heat dissipating film, the heat dissipating film is formed such that an outer circumferential edge of the main surface of the pair of main surfaces of the heat dissipating film at a side farther from the second main surface of the piezoelectric substrate is located in the inner side portion relative to the outer circumference of the second main surface. In this case, contact between the heat dissipating film and other portions and other components is able to be prevented more effectively.

In another specific aspect of a method for manufacturing an elastic wave device according to a preferred embodiment of the present invention, in the forming of the heat dissipating film, the heat dissipating film is formed such that an outer circumference of the heat dissipating film is located in the inner side portion relative to the outer circumference of the second main surface when seen from above from the second main surface side. In this case, contact between the heat dissipating film and other portions and other components is able to be prevented much more effectively.

In still another specific aspect of a method for manufacturing an elastic wave device according to a preferred embodiment of the present invention, the method further includes segmenting a mother substrate to provide the plurality of piezoelectric substrates, and in the forming of the heat dissipating film, after the mother substrate is segmented, the heat dissipating film is formed on each of the second main surfaces of the piezoelectric substrates. In this case, extension of the heat dissipating film due to ductility and malleability of a material in segmentation is able to be prevented. Accordingly, the probability of contact between the heat dissipating film and other portions and other components is further reduced.

In still another specific aspect of a method for manufacturing an elastic wave device according to a preferred embodiment of the present invention, in the forming of the heat dissipating film, the mother substrate or the second main surfaces of the segmented piezoelectric substrates are subject to back grinding processing, and after the back grinding processing, the heat dissipating film is formed on each of the second main surfaces of the piezoelectric substrates. In this case, the heat dissipating film is able to be formed while performing the back grinding processing.

In still another specific aspect of a method for manufacturing an elastic wave device according to a preferred embodiment of the present invention, the heat dissipating film is formed using a mask or a film resist. Usage of the mask or the film resist easily forms the heat dissipating film including a desired planar shape.

In still another specific aspect of a method for manufacturing an elastic wave device according to a preferred embodiment of the present invention, in the forming of the heat dissipating film, the heat dissipating film is tapered such that an area of the heat dissipating film is decreased as it extends farther from the second main surface of the piezoelectric substrate. In this case, the probability of contact between the heat dissipating film and other portions and other components is further reduced.

In still another specific aspect of a method for manufacturing an elastic wave device according to a preferred embodiment of the present invention, the method further includes providing a support member made of resin on the first main surface of the piezoelectric substrate so as to surround the IDT electrode, and providing a lid member made of resin on the support member so as to seal a cavity surrounding the IDT electrode. In this case, the elastic wave device including a wafer-level packaging (WLP) structure is able to be provided.

An elastic wave device according to another preferred embodiment of the present invention includes a piezoelectric substrate including first and second opposing main surfaces, an IDT electrode provided on the first main surface of the piezoelectric substrate, and a heat dissipating film provided on the second main surface of the piezoelectric substrate and including a pair of opposing main surfaces and side surfaces connecting the pair of main surfaces, wherein at least a portion of the side surfaces of the heat dissipating film is located in an inner side portion relative to an outer circumference of the second main surface of the piezoelectric substrate on an arbitrary cross section along a direction connecting the pair of main surfaces of the heat dissipating film.

In a specific aspect of an elastic wave device according to a preferred embodiment of the present invention, an outer circumferential edge of the main surface of the pair of main surfaces of the heat dissipating film at a side farther from the second main surface of the piezoelectric substrate is located in the inner side portion relative to the outer circumference of the second main surface. In this case, contact between the heat dissipating film and other portions and other components is able to be prevented more effectively.

In another specific aspect of an elastic wave device according to a preferred embodiment of the present invention, an outer circumference of the heat dissipating film is located in the inner side portion relative to the outer circumference of the second main surface when seen from above from the second main surface side. In this case, contact between the heat dissipating film and other portions and other components is able to be prevented more effectively.

In still another specific aspect of an elastic wave device according to a preferred embodiment of the present invention, the second main surface of the piezoelectric substrate is subject to back grinding processing. In this case, the elastic wave device is able to be reduced in thickness.

In still another specific aspect of an elastic wave device according to a preferred embodiment of the present invention, the heat dissipating film is tapered such that an area of the heat dissipating film is decreased as it extends farther from the second main surface of the piezoelectric substrate. In this case, the probability of contact between the heat dissipating film and other portions and other components is further reduced.

In still another specific aspect of an elastic wave device according to a preferred embodiment of the present invention, the heat dissipating film is a dielectric film containing no metal film. In this case, there is no risk of short-circuit of the heat dissipating film with other portions and other components.

In still another specific aspect of an elastic wave device according to a preferred embodiment of the present invention, the device further includes a support member provided on the first main surface of the piezoelectric substrate so as to surround the IDT electrode and made of resin, and a lid member provided on the support member so as to seal a cavity surrounding the IDT electrode and made of resin. In this case, the elastic wave device including a WLP structure is provided.

In still another specific aspect of an elastic wave device according to a preferred embodiment of the present invention, the heat dissipating film overlaps with the IDT electrode provided on the first main surface when seen from above from a side of the second main surface of the piezoelectric substrate. In this case, heat generated by the IDT electrode is dissipated by passing through the piezoelectric substrate and the heat dissipating film more effectively.

In still another specific aspect of an elastic wave device according to a preferred embodiment of the present invention, the device further includes an external terminal arranged on the first main surface of the piezoelectric substrate, and the heat dissipating film overlaps with the external terminal when seen from above and from a side of the second main surface of the piezoelectric substrate. In this case, heat is rapidly dissipated to the heat dissipating film from the external terminal with the piezoelectric substrate interposed therebetween.

In still another specific aspect of an elastic wave device according to a preferred embodiment of the present invention, the device further includes a protection film that covers at least a portion of the heat dissipating film. In this case, corrosion and oxidation of the heat dissipating film is able to be prevented.

In still another specific aspect of an elastic wave device according to a preferred embodiment of the present invention, the device further includes a close contact layer provided between the heat dissipating film and the second main surface of the piezoelectric substrate. In this case, separation of the heat dissipating film is able to be prevented.

With methods for manufacturing an elastic wave device and elastic wave devices according to various preferred embodiments of the present invention, contact between a heat dissipating film and other portions and other components is difficult to occur because a shape of the heat dissipating film is devised. Accordingly, physical breakage and short-circuit failure due to the contact are effectively prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be made clear by explaining specific preferred embodiments of the present invention with reference to the drawings.

It should be noted that respective preferred embodiments described in the specification are examples and partial replacements or combinations of components among different preferred embodiments can be made.

Figure 1A:
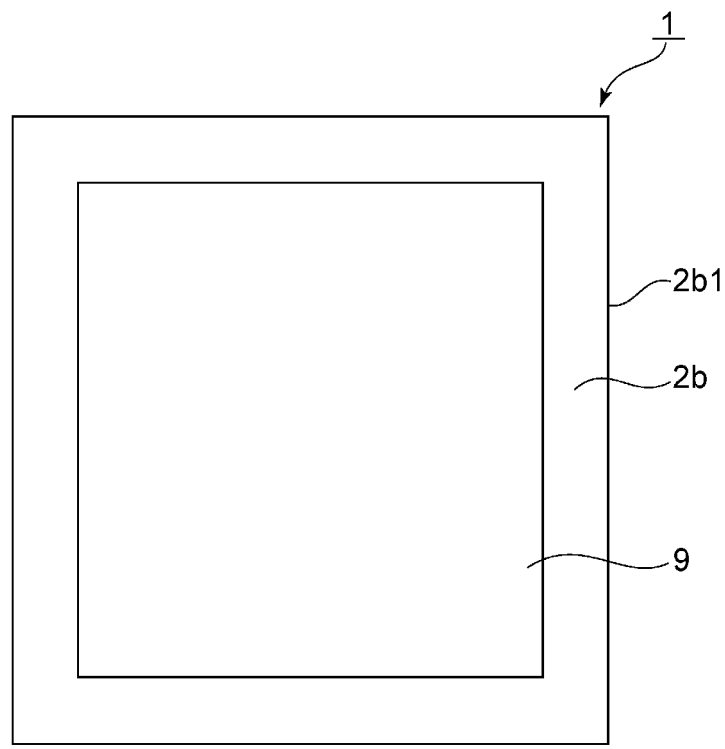
FIGS. 1A and 1B are a plan view and a schematic elevational cross-sectional view of an elastic wave device according to a first preferred embodiment of the present invention.
Figure 1B:
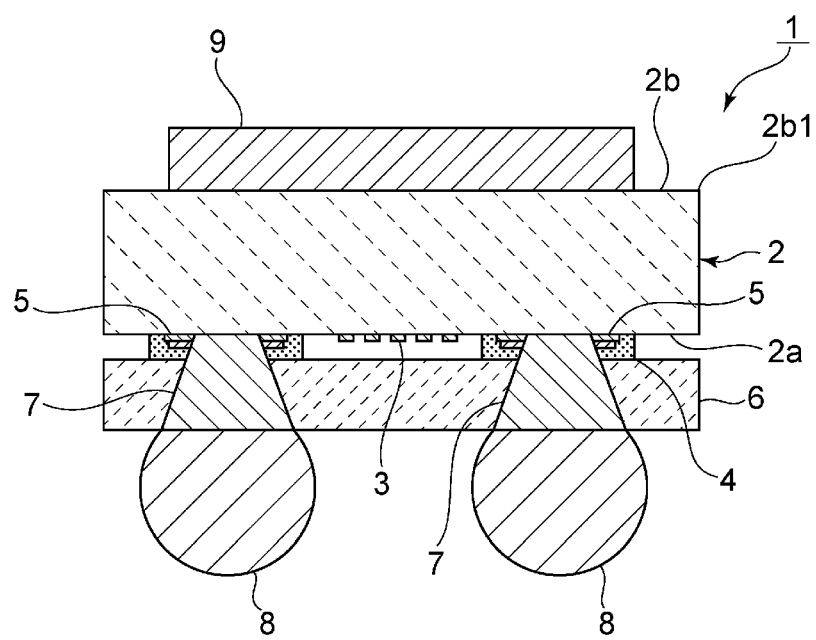

FIGS. 1A and 1B are a plan view and a schematic elevational cross-sectional view of an elastic wave device according to a first preferred embodiment of the present invention.

An elastic wave device 1 is a surface acoustic wave device including a wafer-level packaging (WLP) structure although it is not particularly limited. To be more specific, the elastic wave device 1 includes a piezoelectric substrate 2. The piezoelectric substrate 2 is made of a piezoelectric single crystal such as $LiTaO_3$ and $LiNbO_3$. The piezoelectric substrate 2 may be made of piezoelectric ceramics.

The piezoelectric substrate 2 includes a first main surface 2a and a second main surface 2b opposing each other.

IDT electrodes 3 as excitation electrodes are provided on the first main surface 2a.

A support member 4 made of resin surrounds a region in which the IDT electrodes 3 are provided. The support member 4 includes a cavity to which the IDT electrodes 3 are exposed.

External terminals 5 are provided on the first main surface 2a. The external terminals 5 are electrically connected to the IDT electrodes 3. The external terminals 5 are provided to electrically connect the IDT electrodes 3 to the outside.

The IDT electrodes 3 and the external terminals 5 are made of appropriate metal or alloy.

A lid member 6 made of resin seals the cavity of the above-described support member 4. The lid member 6 preferably has a plate shape. The resin forming the support member 4 and the lid member 6 is not particularly limited. For example, thermosetting polyimide, epoxy resin, or the like can be used therefor.

Through-holes are provided so as to pass through the support member 4 and the lid member 6. Under bump metal layers 7 are provided in the through-holes. The under bump metal layers 7 are made of appropriate metal or alloy. Metal bumps 8 are provided on the under bump metal layers 7. The metal bumps 8 are made of appropriate metal or alloy such as Au and solder.

In the elastic wave device 1, a heat dissipating film 9 is provided on the second main surface 2b of the piezoelectric substrate 2. A planar shape of the heat dissipating film 9 preferably is rectangular or substantially rectangular although it is not particularly limited. The heat dissipating film 9 is made of metal in the present preferred embodiment. A material of the heat dissipating film 9 is not particularly limited and may be a material other than metal. That is to say, the heat dissipating film 9 can be formed with an appropriate material including higher thermal conductivity than that of the piezoelectric substrate 2. Accordingly, a dielectric film containing no metal may be used as the heat dissipating film 9. In this case, short-circuit failure due to contact between the heat dissipating film 9 and other portions and other components is able to be prevented reliably.

Examples of the dielectric film containing no metal can include insulating ceramics such as alumina, plastics, and the like.

The elastic wave device 1 has a characteristic that the outer circumference of the heat dissipating film 9 is located in an inner side portion relative to the outer circumference of the second main surface 2b. Accordingly, as illustrated in FIG. 1A, a portion of the second main surface 2b is present in an outer side portion of the outer circumferential edge of the heat dissipating film 9 when the elastic wave device 1 is seen from above. In other words, the outer circumferential edge of the heat dissipating film 9 is spaced from an outer circumferential edge 2b1 of the second main surface 2b.

In the elastic wave device 1, the heat dissipating film 9 is made of metal and has high thermal conductivity. In the elastic wave device 1, a voltage is applied to the IDT electrodes 3 to excite surface acoustic waves. Accordingly, heat is generated in the IDT electrodes 3. The heat is dissipated from the heat dissipating film 9 with the piezoelectric substrate 2 interposed therebetween.

In addition, the heat dissipating film 9 is made of metal and the outer circumferential edge thereof is located in the inner side portion relative to the outer circumferential edge 2b1 of the second main surface 2b. Accordingly, when the elastic wave device 1 is handled, the heat dissipating film 9 is difficult to make contact with other portions and other components. Therefore, the heat dissipating film 9 is difficult to be broken and short-circuit failure is difficult to occur therein even when the heat dissipating film 9 is metal including conductivity.

It should be noted that the outer circumferential edge of the heat dissipating film 9 is not necessarily required to be located in the inner side portion relative to the outer circumferential edge 2b1 of the second main surface 2b. As will be described later by referring to second to seventh preferred embodiments, in the invention, it is sufficient that at least a portion of the side surfaces of the heat dissipating film is located in the inner side portion relative to the outer circumferential edge 2b1 of the second main surface 2b on an arbitrary cross section connecting the pair of opposing main surfaces of the heat dissipating film.

In the elastic wave device 1, the IDT electrodes 3 are sealed in a space surrounded by the piezoelectric substrate 2, the support member 4, and the lid member 6. Therefore, the heat generated in the IDT electrodes 3 is difficult to be dissipated. In such an elastic wave device including a WLP structure, heat dissipation property is strongly required to be improved. According to the present preferred embodiment, the heat is able to be dissipated effectively using the above-described heat dissipating film 9. Accordingly, various preferred embodiments of the present invention are more effective for the elastic wave device 1 including the WLP structure.

Figure 2:
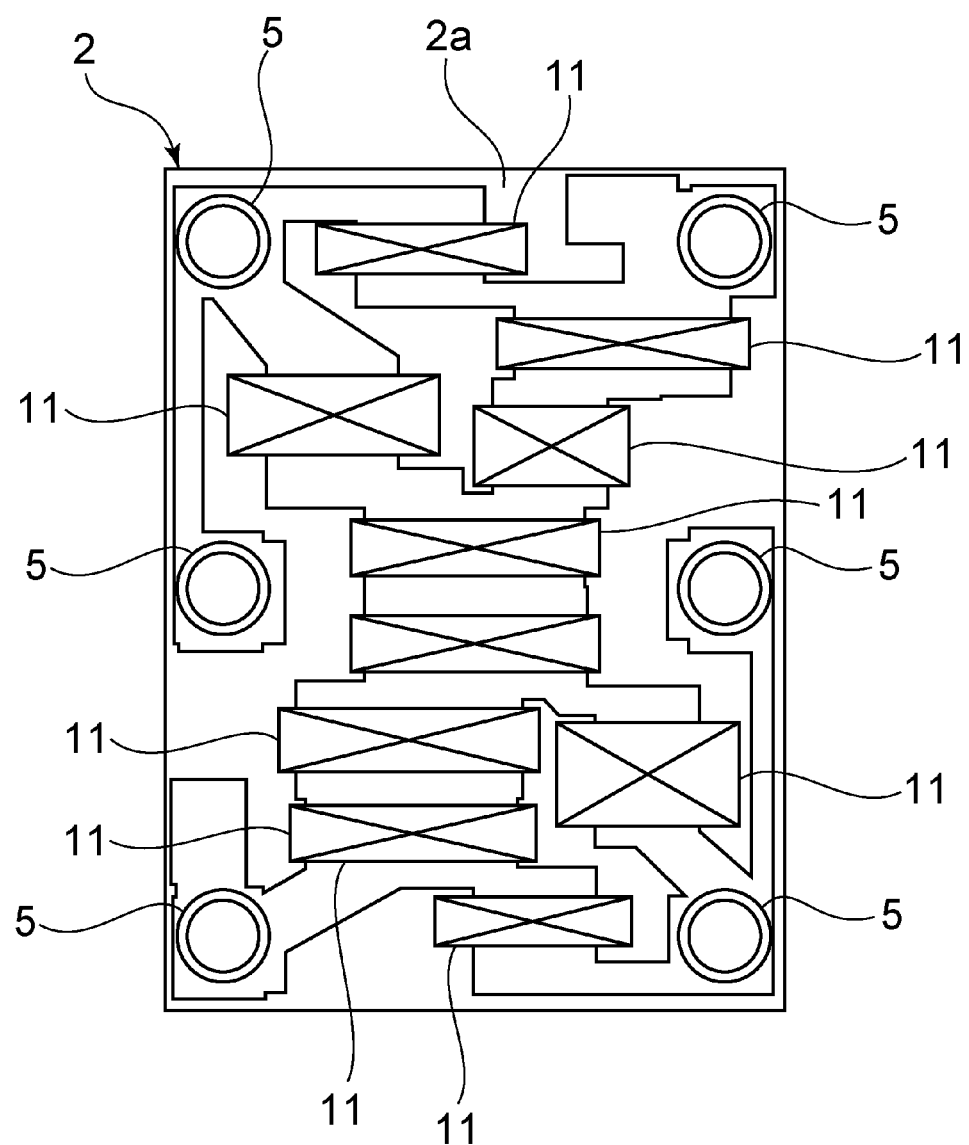
FIG. 2 is a plan view schematically illustrating an electrode configuration on a piezoelectric substrate in the elastic wave device according to the first preferred embodiment of the present invention.

FIG. 2 is a schematic plan view illustrating an electrode configuration on the first main surface 2a of the above-described piezoelectric substrate 2. In more detail, the plurality of IDT electrodes are provided on the first main surface 2a. Each of symbols formed by surrounding marks X by rectangular frames in FIG. 2 indicates a structure in which the IDT electrode and reflectors at both of the sides of the IDT electrode are provided. That is to say, a one-port surface acoustic wave resonator 11 is provided in each of regions indicated by the marks X and the rectangular frames surrounding the marks X. The plurality of one-port surface acoustic wave resonators 11 are electrically connected to configure a ladder filter.

Furthermore, the plurality of external terminals 5 are provided to electrically connect the one-port surface acoustic wave resonators 11 and the like in FIG. 2 to the outside.

Figure 3:
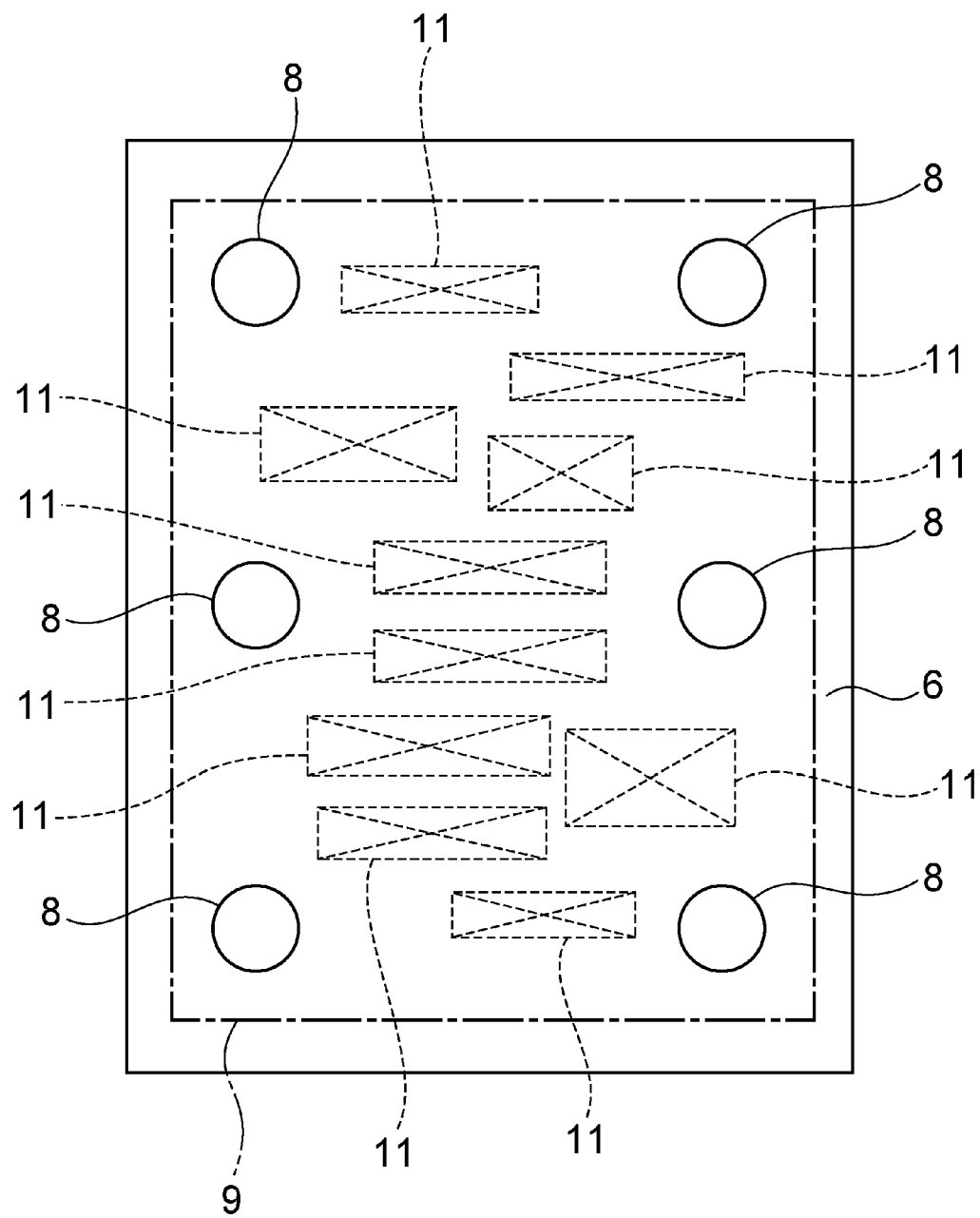
FIG. 3 is a bottom view of the elastic wave device according to the first preferred embodiment of the present invention when seen from the side of a first main surface of the piezoelectric substrate.

FIG. 3 is a bottom view of the above-described elastic wave device 1. In FIG. 3, only elements and features of the one-port surface acoustic wave resonators 11 are illustrated with dashed lines in a simplified manner.

A dashed-dotted line in FIG. 3 indicates the outer circumferential edge of the heat dissipating film 9 provided at the side of the second main surface 2b of the piezoelectric substrate 2. As is seen from FIG. 3, the heat dissipating film 9 overlaps with a region in which the one-port surface acoustic wave resonators 11 are provided when the elastic wave device 1 is seen from above from the second main surface 2b side. As described above, in the surface acoustic wave resonators, first, heat is generated in the IDT electrodes 3. The heat is rapidly dissipated to the side of the heat dissipating film 9 overlapping with the IDT electrodes 3 with the piezoelectric substrate 2 interposed therebetween. Therefore, the heat dissipation property is able to be enhanced more effectively.

The external terminals 5 illustrated in FIG. 1B are electrically connected to the IDT electrodes 3. Accordingly, heat is also transmitted to the external terminals 5 rapidly. In the present preferred embodiment, the heat dissipating film 9 overlaps with the external terminals 5 with the piezoelectric substrate 2 interposed therebetween when the elastic wave device is seen from above from the second main surface 2b side. Also with this configuration, the heat generated in the IDT electrodes 3 is able to be dissipated from the heat dissipating film 9 more effectively.

Furthermore, in the elastic wave device 1 in the present preferred embodiment, as is clear from a manufacturing method, which will be described later, the piezoelectric substrate 2 is subject to back grinding processing (processing of grinding the back surface of wafer). To be more specific, the main surface of the piezoelectric substrate 2 at the opposite side to the first main surface 2a is subject to the back grinding processing to provide the second main surface 2b, thus reducing the piezoelectric substrate 2 in thickness. Therefore, the elastic wave device 1 can be reduced in thickness.

Figure 4A:
FIGS. 4A to 4D are simplified elevational cross-sectional views for explaining a method for manufacturing an elastic wave device according to the first preferred embodiment of the present invention.
Figure 4B:
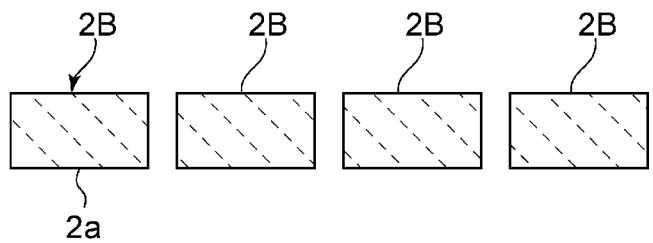

Next, the method for manufacturing the elastic wave device 1 will be described with reference to FIGS. 4A-4D and FIG. 5. As illustrated in FIG. 4A, a mother substrate 2A is prepared. Then, the mother substrate 2A is segmented by cutting it with a dicing machine or the like. With this processing, a plurality of piezoelectric substrates 2B are obtained as illustrated in FIG. 4B.

In the above-described segmentation, the mother substrate 2A is adhered to, for example, a dicing tape and is cut with the dicing machine or the like in this state. With this processing, the plurality of piezoelectric substrates 2B are prepared in a state of being adhered to the dicing tape. If necessary, the dicing tape may be extended after the cutting with the dicing machine to enlarge spaces between the piezoelectric substrates 2B.

Subsequently, the piezoelectric substrates 2B are ground. To be more specific, the surfaces of the piezoelectric substrates 2B at the side opposite to the surfaces adhered to the dicing tape, that is, the surfaces forming the second main surfaces 2b finally are ground. This grinding processing corresponds to the above-described back grinding processing.

Figure 4C:
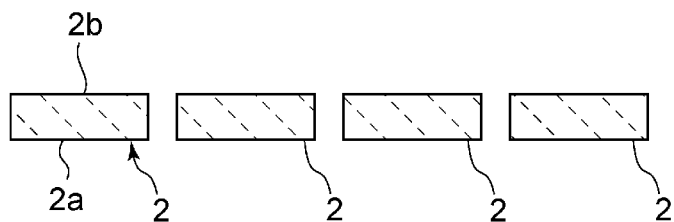

With this processing, as illustrated FIG. 4C, the plurality of piezoelectric substrates 2 reduced in thickness are able to be obtained. A grinding method for the above-described back grinding processing is not particularly limited and a grinding wheel or the like can be used.

Figure 4D:
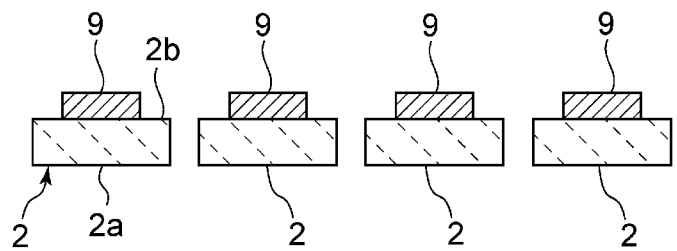

Then, in the state of being held on the dicing tape, the heat dissipating films 9 are formed on the second main surfaces 2b of the piezoelectric substrates 2 as illustrated in FIG. 4D. The method for forming the heat dissipating films 9 is not particularly limited.

With the method illustrated in FIGS. 4A to 4D, the back grinding processing is performed after the segmentation. Therefore, chipping on the back surfaces, such as scratches and flaws, which are generated in the segmentation by cutting with the dicing machine, are able to be reduced. Furthermore, the mother substrate 2A (wafer) needs not to be handled in a state of being reduced in thickness. This lowers the possibility of damage and the like.

As the method illustrated in FIGS. 4A to 4D, for example, the following first or second method may be used. In the first method, the back grinding processing is performed before the segmentation. In this method, the mother substrate 2A is subject to the back grinding processing in the state of FIG. 4A, and then, is segmented. Finally, the heat dissipating films 9 are formed as illustrated in FIG. 4D. In this method, the overall piezoelectric substrate is subjected to the back grinding processing in the state of FIG. 4A and the grinding amount is therefore made uniform easily among the chips.

The second method is referred to as a dicing before grinding (DBG) method and will be described in the fifth preferred embodiment later.

Figure 5:
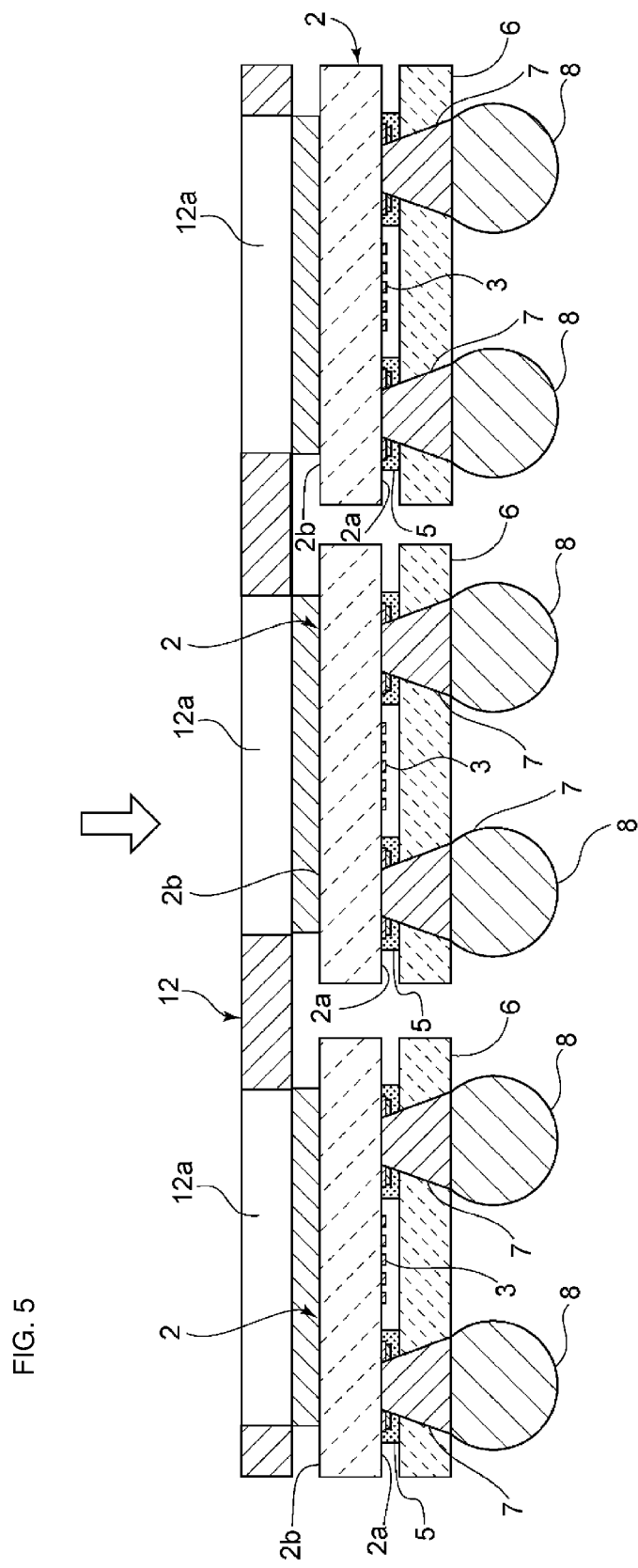
FIG. 5 is an elevational cross-sectional view for explaining a process of forming a heat dissipating film in the method for manufacturing the elastic wave device according to the first preferred embodiment of the present invention.

Moreover, as a method to determine the shapes of the heat dissipating films 9, a mask 12 including cavities 12a is desirably used as illustrated in FIG. 5. A metal mask is desirably used as the mask 12. The use of the mask 12 prevents the heat dissipating films 9 from adhering to the side surfaces of the piezoelectric substrates 2 formed by the segmentation and forms the shapes of the heat dissipating films 9 with high accuracy. The mask 12 may be formed with another material. The planar shapes of the cavities 12a of the mask 12 are the same as the planar shapes of the heat dissipating films 9 that are formed. Various shapes of the heat dissipating films 9 are able to be achieved as illustrated in FIG. 1B, FIG. 6B, FIG. 10, and FIG. 11 by devising the shape of the mask 12.

It should be noted that in the present preferred embodiment, the cavities 12a preferably have rectangular or substantially rectangular shapes, for example.

The mask 12 is arranged on the second main surfaces 2b of the piezoelectric substrates 2 or at an upper portion of the second main surfaces 2b to cause a heat dissipating film formation material to be deposited thereon as indicated by an arrow. With this, the heat dissipating films 9 are able to be formed. When the mask 12 is used, the heat dissipating films 9 including any of various planar shapes are able easily formed by changing the shapes of the cavities 12a.

The heat dissipating films 9 may be formed by a photolithography method using a film resist instead of the above-described mask 12.

In the above-described manner, the heat dissipating films 9 are able to be formed on the piezoelectric substrates 2.

With this manufacturing method, the heat dissipating films 9 are formed after the segmentation. Therefore, a problem that the heat dissipating film formation material is extended during the segmentation is not generated. Accordingly, contact between the heat dissipating films 9 and other portions and other components such as other electronic components are more difficult to occur.

When a metal film or a dielectric film such as a heat dissipating film is formed on the overall one main surface of the mother substrate, there arises a problem that warpage is generated on the mother substrate. In the present preferred embodiment, such warpage of the piezoelectric substrate is also difficult to be generated because the heat dissipating films 9 are formed after the segmentation.

The heat dissipating films 9 may be formed before the segmentation. Even in this case, the contact between the heat dissipating films 9 and other portions and other components is made difficult to occur by causing the outer circumferential edges of the heat dissipating films 9 to be located in the inner side portions relative to the outer circumferential edges of the second main surfaces 2b of the piezoelectric substrates 2.

As described above, the elastic wave devices 1 is able to be manufactured by performing the segmentation by cutting with the dicing machine, the back grinding processing, and the formation of the heat dissipating films 9 in this order. Accordingly, the back grinding processing and the formation processing of the heat dissipating films 9 are easily performed after the cutting processing with the dicing machine by applying the existing cutting technique with the dicing machine using the dicing tape, as described above.

It is desired that the electrode configurations including the IDT electrodes 3 and the external terminals 5 illustrated in FIG. 1B are previously formed in a process of preparing the mother substrate 2A. That is to say, the configurations other than the metal bumps 8 are desirably formed at the side of the first main surfaces 2a at a stage of the mother substrate 2A. It is sufficient that the metal bumps 8 are provided on the under bump metal layers 7 after the above-described heat dissipating films 9 are formed.

The process of forming the above-described electrode configurations, the process of forming the support members 4, and the process of laminating the lid members 6 may be executed after the heat dissipating films 9 are formed.

Figure 6A:
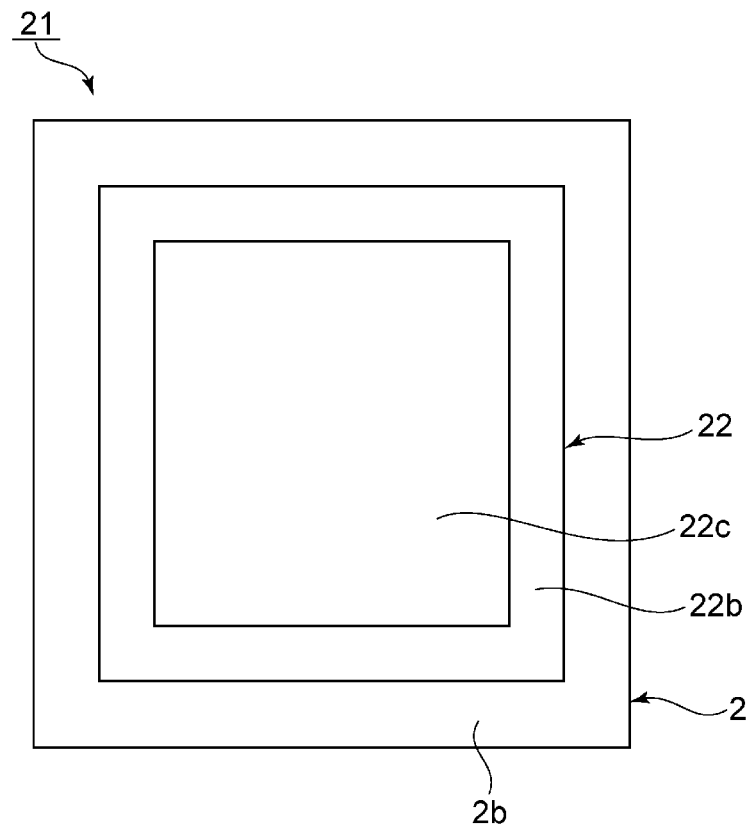
FIGS. 6A and 6B are schematic plan views and a schematic elevational cross-sectional view of an elastic wave device according to a second preferred embodiment of the present invention.
Figure 6B:
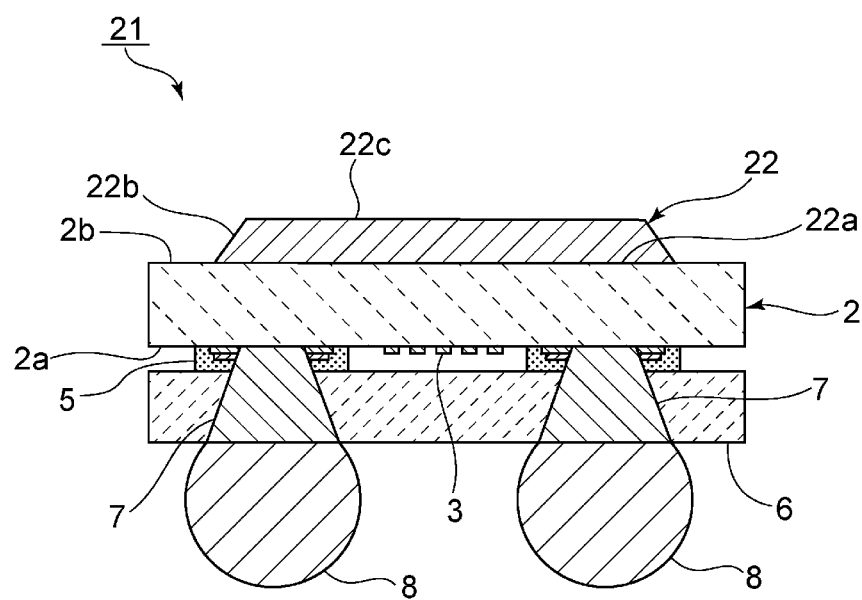

FIGS. 6A and 6B are a schematic plan view and a schematic elevational cross-sectional view of an elastic wave device according to a second preferred embodiment of the present invention.

An elastic wave device 21 according to the second preferred embodiment is preferably the same as the elastic wave device 1 in the first preferred embodiment other than a point that it includes a taped heat dissipating film 22. Accordingly, the same reference numerals denote the same parts and description in the first preferred embodiment is applied thereto. Also in the following third to fifth preferred embodiments, the same reference numerals denote the same elements and features as those in the elastic wave device 1 in the first preferred embodiment and description thereof is omitted in the same manner.

In the elastic wave device 21 according to the second preferred embodiment, a heat dissipating film 22 is provided instead of the heat dissipating film 9. The heat dissipating film 22 includes a lower surface 22a and an upper surface 22c defining a pair of opposing main surfaces. The lower surface 22a makes contact with the second main surface 2b of the piezoelectric substrate 2. Side surfaces 22b connect the lower surface 22a and the upper surface 22c. The heat dissipating film 22 is tapered such that the area of the heat dissipating film 22 is reduced toward the upper surface 22c from the lower surface 22a. In other words, the side surfaces 22b are inclined so as to be closer to the center side of the upper side.

Accordingly, the heat dissipating film 22 is more difficult to make contact with other portions and other components. Therefore, physical breakage and short-circuit failure of the heat dissipating film 22 are more difficult to occur in the elastic wave device 21.

The tapered heat dissipating film 22 is easily formed by the above-described method using the mask or the film resist.

Figure 7:
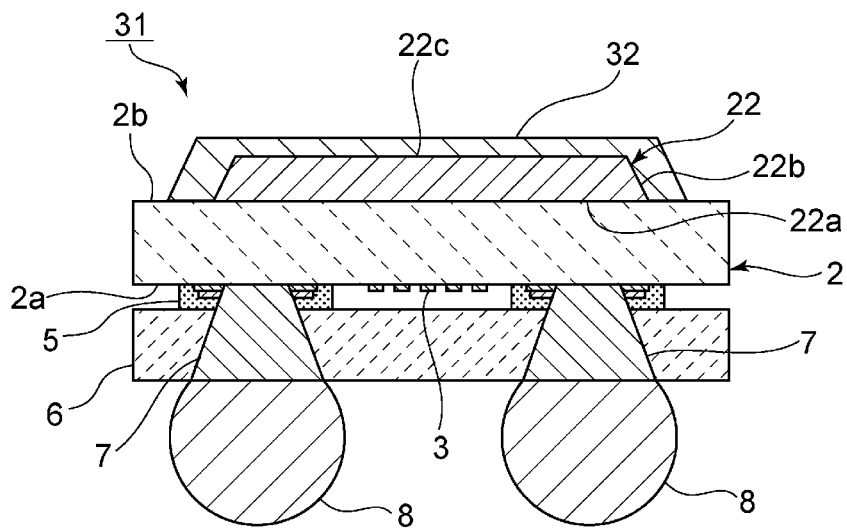
FIG. 7 is a schematic elevational cross-sectional view of an elastic wave device according to a third preferred embodiment of the present invention.

In an elastic wave device 31 in the third preferred embodiment illustrated in FIG. 7, a protection film 32 covers the upper surface 22c and the side surfaces 22b of the heat dissipating film 22. The protection film 32 is able to be formed with an inorganic dielectric such as $SiO_2$ or an appropriate material such as synthetic resin. Formation of the protection film 32 prevents corrosion and oxidation of the heat dissipating film 22.

It should be noted that the shape of the heat dissipating film may be not the tapered shape as that of the heat dissipating film 22 but any of various shapes illustrated in FIG. 1B, FIG. 6B, FIG. 10, and FIG. 11. In this case, the protection film is protects an entirety or a portion of the heat dissipating film. When the protection film protects the overall heat dissipating film, it is formed so as to cover the upper surface and the side surfaces of the heat dissipating film. When the protection film protects a portion of the heat dissipating film, it may be formed so as to cover any one of the upper surface and the side surfaces of the heat dissipating film or cover a portion of the upper surface and a portion of the side surfaces.

Figure 8:
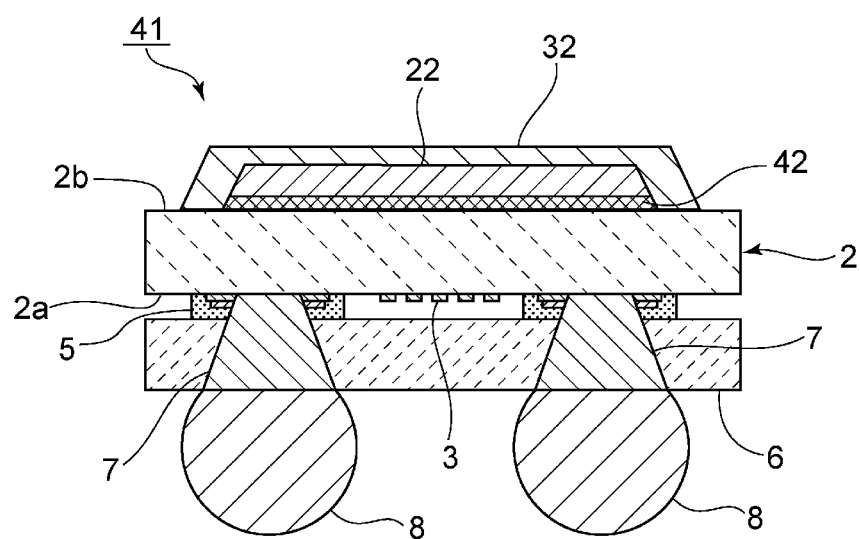
FIG. 8 is a schematic elevational cross-sectional view of an elastic wave device according to a fourth preferred embodiment of the present invention.

In an elastic wave device 41 according to the fourth preferred embodiment illustrated in FIG. 8, a close contact layer 42 is provided on the second main surface 2b of the piezoelectric substrate 2. The heat dissipating film 22 is laminated on the close contact layer 42. The close contact layer 42 is made of a material excellent in close contact property with the piezoelectric substrate 2 rather than the heat dissipating film 22. The close contact layer 42 is able to be formed with Ti, NiCr, or the like as the material when the piezoelectric substrate 2 is made of the piezoelectric single crystal and the heat dissipating film 22 is made of metal such as Al.

Figure 9:
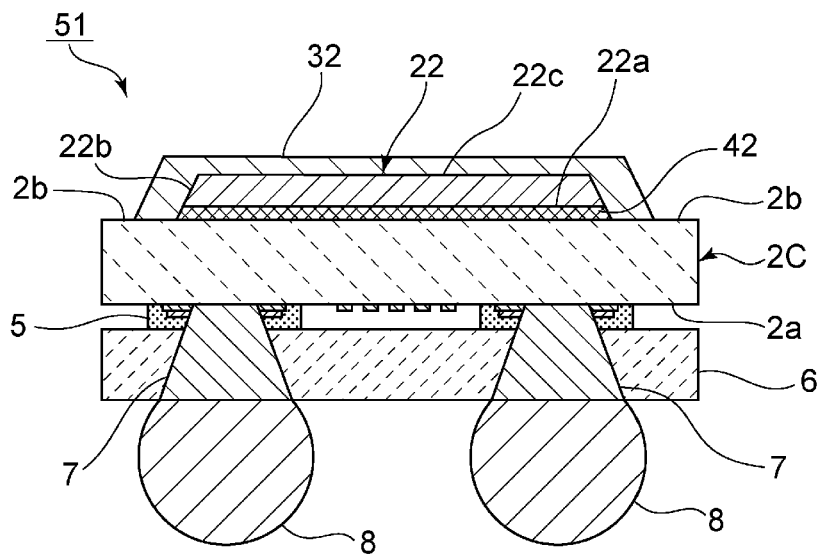
FIG. 9 is a schematic elevational cross-sectional view of an elastic wave device according to a fifth preferred embodiment of the present invention.

As described above, the shape of the heat dissipating film may be not the tapered shape as that of the heat dissipating film 22 but any of various shapes illustrated in FIG. 1B, FIG. 6B, FIG. 10, and FIG. 11. Therefore, the shape of the close contact layer can also be changed in accordance with the shape of the heat dissipating film. In an elastic wave device 51 according to the fifth preferred embodiment illustrated in FIG. 9, the second main surface 2b of a piezoelectric substrate 2C is a surface formed by being subject to the back grinding processing by the DBG method. The DBG method is a method of segmenting the piezoelectric substrate by making cuts to halfway portions of the piezoelectric substrate with a dicing machine and performing the back grinding processing on the back surface (main surface opposing the surface with the cuts) of the piezoelectric substrate when the piezoelectric substrate is segmented. The second main surface 2b is formed by performing the back grinding processing by the DBG method. Therefore, the piezoelectric substrate 2C is reduced in thickness. With the DBG method, the back grinding processing is performed after the segmentation and chipping (scratches and flaws) on the back surface, which are generated in the segmentation by cutting with the dicing machine, is able to be reduced. Furthermore, the mother substrate 2A (wafer) needs not to be handled in a state of being reduced in thickness, thus providing an advantage that the possibility of damage and the like is lowered. Moreover, the DBG method is a method for segmentation while performing the back grinding processing. This also provides an advantage that the grinding amount is able to be easily made uniform among the chips. Other points in the elastic wave device 51 are the same as those in the elastic wave device 41.

Figure 10:
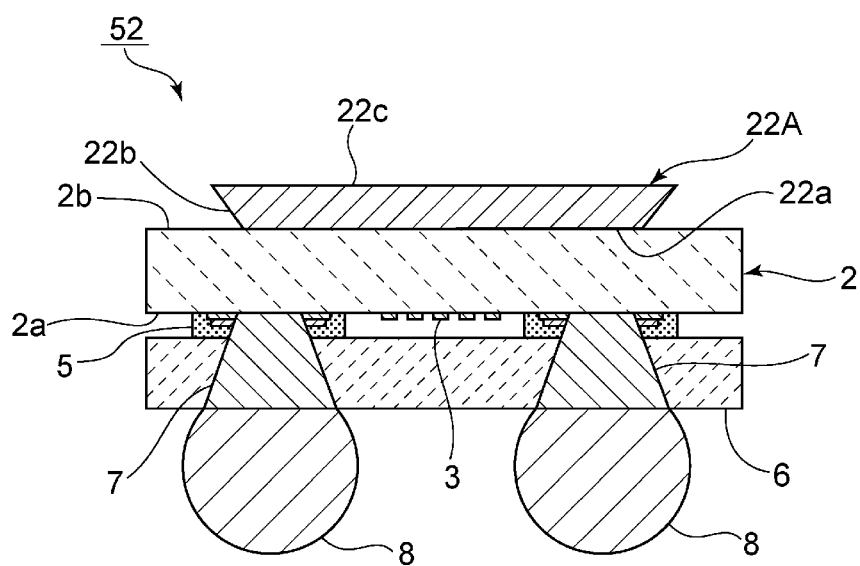
FIG. 10 is a schematic elevational cross-sectional view of an elastic wave device according to a sixth preferred embodiment of the present invention.

An elastic wave device 52 according to the sixth preferred embodiment illustrated in FIG. 10 is a variation on the elastic wave device 21 according to the second preferred embodiment illustrated in FIG. 6B. More specifically, a heat dissipating film 22A is used instead of the heat dissipating film 22. A different point is that the heat dissipating film 22A is reversely tapered to the heat dissipating film 22. That is to say, the heat dissipating film 22A is reversely tapered such that an area of the heat dissipating film 22A is decreased toward the lower surface 22a from the upper surface 22c. Accordingly, the side surfaces 22b are located in the inner side portion relative to the outer circumferential edge of the second main surface 2b of the piezoelectric substrate 2 as it extends closer to the lower surface 22a from the upper surface 22c. Also in this case, the outer circumferential edge of the upper surface 22c is located in the inner side portion relative to the outer circumferential edge of the second main surface 2b of the piezoelectric substrate 2. Therefore, contact between the heat dissipating film 22A and other portions and other components is able to be prevented more effectively.

In the elastic wave device 52, the outer circumferential edge of the upper surface 22c may be present at a position overlapping with the outer circumferential edge of the second main surface 2b of the piezoelectric substrate 2. Also in this case, remaining portions of the side surfaces 22b other than the upper ends thereof are located in the inner side portion relative to the outer circumferential edge of the piezoelectric substrate 2 on an arbitrary cross section along the direction connecting the lower surface 22a and the upper surface 22c. Accordingly, also in this case, contact between the heat dissipating film 22A and other portions and other components is able to be prevented.

Figure 11:
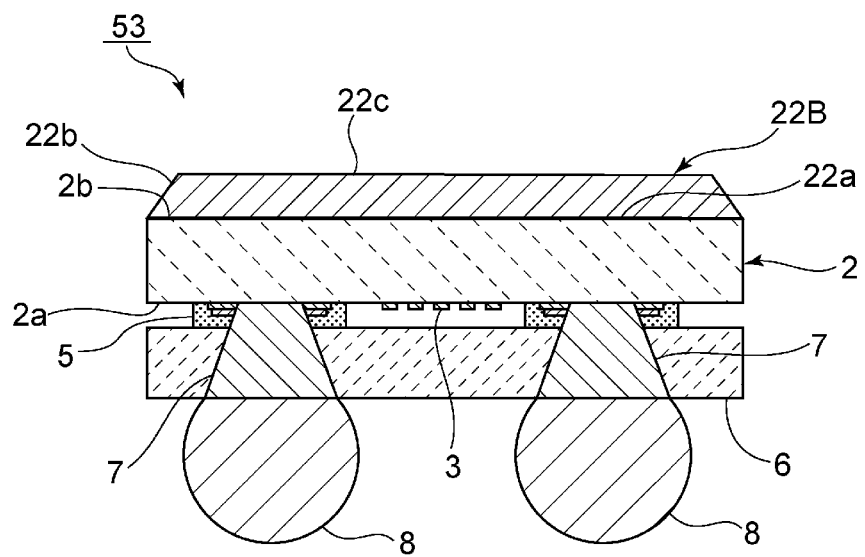
FIG. 11 is a schematic elevational cross-sectional view of an elastic wave device according to a seventh preferred embodiment of the present invention.

An elastic wave device 53 according to the seventh preferred embodiment illustrated in FIG. 11 also corresponds to a variation on the elastic wave device 21 according to the second preferred embodiment. A different point is that a heat dissipating film 22B is provided instead of the heat dissipating film 22. The heat dissipating film 22B is tapered such that an area of the heat dissipating film 22B is decreased toward the upper surface 22c from the lower surface 22a in the same manner as the heat dissipating film 22. It should be noted that that in the heat dissipating film 22B, the outer circumferential edge of the lower surface 22a is located at a position overlapping with the outer circumferential edge of the second main surface 2b of the piezoelectric substrate 2.

Also in this case, remaining portions of the side surfaces 22b other than the lower ends thereof are located in the inner side portion relative to the outer circumferential edge of the second main surface 2b of the piezoelectric substrate 2 on an arbitrary cross section along the direction connecting the upper surface 22c and the lower surface 22a. Accordingly, contact between the heat dissipating film 22B and other portions and other components are also able to be prevented.

As in the elastic wave device 53 according to the seventh preferred embodiment, a portion of the heat dissipating film may be located at the position overlapping with the outer circumferential edge of the second main surface 2b of the piezoelectric substrate 2. Contact between the heat dissipating film 22B and other portions and other components is able to be prevented simply by causing at least a portion of the side surfaces 22b to be located in the inner side portion relative to the outer circumferential edge of the piezoelectric substrate 2 on the arbitrary cross section along the direction connecting the pair of opposing main surfaces of the heat dissipating film, that is, the upper surface 22c and the lower surface 22a.

Other configurations of the elastic wave devices 52 and 53 according to the sixth and seventh preferred embodiments are the same as those of the elastic wave device 21 according to the second preferred embodiment.

Other configurations of the above-described elastic wave devices 21, 31, 41, 51, 52, and 53 according to the second to seventh preferred embodiments are the same as those of the elastic wave device 1 according to the first preferred embodiment. Therefore, in the same manner as the elastic wave device 1, heat generated in the IDT electrodes 3 is able to be effectively dissipated from the heat dissipating film 22, 22A, or 22B. Furthermore, contact between the heat dissipating film 22, 22A, or 22B and other portions and other components are difficult to occur and breakage and short-circuit failure of the heat dissipating film 22, 22A, or 22B are therefore difficult to occur.

Also in the second to fifth preferred embodiments, in the same manner as the first preferred embodiment, the heat dissipating film 22 preferably overlaps with the IDT electrodes 3 and/or overlaps with the external terminals 5. This enhances heat dissipation property more effectively.

Elastic wave devices according to various preferred embodiments of the present invention are widely used for various electronic apparatuses and communication apparatuses. Examples of the electronic apparatuses include a sensor. Examples of the communication apparatuses include a duplexer including an elastic wave device according to a preferred embodiment of the present invention, a communication module apparatus including an elastic wave device according to a preferred embodiment of the present invention and a power amplifier (PA) and/or a low noise amplifier (LNA), a movable body communication apparatus and a health care communication apparatus including the communication module apparatus, and the like. Examples of the movable body communication apparatus include a cellular phone, a smart phone, a car navigation system, and the like. Examples of the health care apparatus include a weight meter, a body fat meter, and the like. The health care apparatus and the movable body communication apparatus include an antenna, a radio frequency (RF) module, a large-scale integrated circuit (LSI), a display, an input unit, a power supply, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate including first and second opposing main surfaces;
    an IDT electrode provided on the first main surface of the piezoelectric substrate; and
    a heat dissipating film provided on the second main surface of the piezoelectric substrate and including a pair of opposing main surfaces and side surfaces connecting the pair of main surfaces; wherein
    at least a portion of the side surfaces of the heat dissipating film is located in an inner side portion relative to an outer circumference of the second main surface of the piezoelectric substrate on an arbitrary cross section along a direction connecting the pair of main surfaces of the heat dissipating film; and
    the heat dissipating film overlaps with the IDT electrode provided on the first main surface when seen from above from a side of the second main surface of the piezoelectric substrate.

2. The elastic wave device according to claim 1, wherein an outer circumferential edge of the main surface of the pair of main surfaces of the heat dissipating film at a side farther from the second main surface of the piezoelectric substrate is located in the inner side portion relative to the outer circumference of the second main surface.

3. The elastic wave device according to claim 1, wherein an outer circumference of the heat dissipating film is located in the inner side portion relative to the outer circumference of the second main surface when seen from above from the second main surface side.

4. The elastic wave device according to claim 1, wherein the second main surface of the piezoelectric substrate includes a back grinded portion.

5. The elastic wave device according to claim 1, wherein the heat dissipating film is tapered such that an area of the heat dissipating film is decreased with increasing distance from the second main surface of the piezoelectric substrate.

6. The elastic wave device according to claim 1, wherein the heat dissipating film is a dielectric film including no metal film.

7. The elastic wave device according to claim 1, further including:
    a support member provided on the first main surface of the piezoelectric substrate so as to surround the IDT electrode and made of resin; and
    a lid member provided on the support member so as to seal a cavity surrounding the IDT electrode and made of resin.

8. The elastic wave device according to claim 1, further comprising:
    an external terminal located on the first main surface of the piezoelectric substrate;
    the heat dissipating film overlaps with the external terminal when seen from above from a side of the second main surface of the piezoelectric substrate.

9. The elastic wave device according to claim 1, further comprising a protection film that covers at least a portion of the heat dissipating film.

10. The elastic wave device according to claim 1, further including a close contact layer provided between the heat dissipating film and the second main surface of the piezoelectric substrate.

* * * * *